US012618917B2

(12) United States Patent
Hussell

(10) Patent No.: US 12,618,917 B2
(45) Date of Patent: May 5, 2026

(54) ERROR DETECTION IN LED PACKAGES

(71) Applicant: CreeLED, Inc., Durham, NC (US)

(72) Inventor: Christopher P. Hussell, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 587 days.

(21) Appl. No.: 18/055,563

(22) Filed: Nov. 15, 2022

(65) Prior Publication Data

US 2024/0159840 A1 May 16, 2024

(51) Int. Cl.
*G01R 31/44* (2020.01)
*G02F 1/13* (2006.01)

(52) U.S. Cl.
CPC ........... *G01R 31/44* (2013.01); *G02F 1/1309* (2013.01)

(58) Field of Classification Search
CPC .. G01R 31/44; G02F 1/1309; G09G 2330/12; G09G 2370/02; G09G 2370/04; G09G 2370/10; G09G 3/32; H04L 1/0061; H04L 1/0082
See application file for complete search history.

(56) References Cited

U.S. PATENT DOCUMENTS

| | | | |
|---|---|---|---|
| 5,359,345 A | 10/1994 | Hunter | |
| 6,016,038 A | 1/2000 | Mueller et al. | |
| 6,150,774 A | 11/2000 | Mueller et al. | |

| | | | |
|---|---|---|---|
| 6,166,496 A | 12/2000 | Lys et al. | |
| 6,211,626 B1 | 4/2001 | Lys et al. | |
| 6,292,901 B1 | 9/2001 | Fys et al. | |

(Continued)

FOREIGN PATENT DOCUMENTS

| | | |
|---|---|---|
| CN | 1965340 A | 5/2007 |
| CN | 101926222 A | 12/2010 |

(Continued)

OTHER PUBLICATIONS

Notice of Reason for Rejection for Japanese Patent Application No. 2021-560354, mailed Mar. 10, 2023, 4 pages.

(Continued)

*Primary Examiner* — Giovanni Astacio-Oquendo
*Assistant Examiner* — Haidong Zhang
(74) *Attorney, Agent, or Firm* — Withrow & Terranova, P.L.L.C.

(57) ABSTRACT

Light-emitting diode (LED) packages and more particularly error detection in LED packages is disclosed. LED packages are arranged for cascade communication as part of a larger LED display. A separate active electrical element is integrated with each LED package for facilitating active matrix addressing from a data stream, checking input error detection codes, and generating new output error detection codes to the data stream. Each electrical element within each LED package is separately capable of changing one or more portions of received data in the data stream, transmitting the changed data to the next downstream LED package, and generating output error detection codes based on the changed data. When the active electrical element identifies corrupted data based on input error detection codes, the generated output error detection codes may be intentionally corrupted so downstream LED packages will also identify the respective data as being corrupted.

23 Claims, 5 Drawing Sheets

(56)  References Cited

U.S. PATENT DOCUMENTS

| | | | |
|---|---|---|---|
| 6,538,626 B1 | 3/2003 | Nieberger et al. | |
| 7,206,001 B1 | 4/2007 | Crandall et al. | |
| 7,579,629 B2 | 8/2009 | Inoguchi | |
| 8,111,001 B2 | 2/2012 | Underwood et al. | |
| 8,328,405 B2 | 12/2012 | Negley | |
| 8,922,458 B2 | 12/2014 | Sefton et al. | |
| 8,937,492 B1 | 1/2015 | Gideon | |
| 8,970,131 B2 | 3/2015 | Brandes et al. | |
| 9,414,454 B2 | 8/2016 | Brandes et al. | |
| 9,717,123 B1 | 7/2017 | Yao | |
| 10,368,411 B2 | 7/2019 | Zhang et al. | |
| 10,384,239 B2 | 8/2019 | Fedigan et al. | |
| 10,453,827 B1 | 10/2019 | Hussell et al. | |
| 10,663,418 B2 | 5/2020 | Magee et al. | |
| 10,682,675 B2 | 6/2020 | Magee et al. | |
| 10,695,805 B2 | 6/2020 | Magee et al. | |
| 10,908,414 B2 | 2/2021 | Revier et al. | |
| 2001/0028356 A1 | 10/2001 | Balogh | |
| 2002/0130627 A1 | 9/2002 | Morgan et al. | |
| 2003/0058885 A1 | 3/2003 | Sorenson et al. | |
| 2004/0160199 A1* | 8/2004 | Morgan | G09G 3/32 |
| | | | 315/312 |
| 2004/0246278 A1 | 12/2004 | Elliott | |
| 2006/0022214 A1 | 2/2006 | Morgan et al. | |
| 2006/0114269 A1 | 6/2006 | Chang-Ho et al. | |
| 2006/0168496 A1* | 7/2006 | Steele | H04L 1/0045 |
| | | | 714/758 |
| 2006/0244681 A1* | 11/2006 | Nakajima | H04B 10/116 |
| | | | 345/46 |
| 2007/0097055 A1 | 5/2007 | Takamura et al. | |
| 2007/0195025 A1 | 8/2007 | Korcharz et al. | |
| 2007/0231846 A1 | 10/2007 | Cosentino et al. | |
| 2007/0237165 A1 | 10/2007 | Chiang | |
| 2007/0296464 A1 | 12/2007 | Lewko | |
| 2008/0018261 A1 | 1/2008 | Kastner | |
| 2008/0062158 A1 | 3/2008 | Willis | |
| 2008/0136844 A1 | 6/2008 | Takada et al. | |
| 2008/0238950 A1 | 10/2008 | Saglam | |
| 2008/0245949 A1 | 10/2008 | Morimoto et al. | |
| 2009/0066526 A1 | 3/2009 | Marshall et al. | |
| 2009/0079362 A1 | 3/2009 | Shteynberg et al. | |
| 2009/0109168 A1 | 4/2009 | Lee et al. | |
| 2009/0147028 A1 | 6/2009 | Sefton et al. | |
| 2009/0164713 A1 | 6/2009 | Tsai et al. | |
| 2009/0179843 A1 | 7/2009 | Ackerman et al. | |
| 2009/0187925 A1 | 7/2009 | Hu et al. | |
| 2009/0201274 A1 | 8/2009 | Kuwabara et al. | |
| 2009/0230885 A1 | 9/2009 | Tanaka | |
| 2009/0278034 A1 | 11/2009 | Ackermann et al. | |
| 2010/0026208 A1 | 2/2010 | Shteynberg et al. | |
| 2010/0085295 A1 | 4/2010 | Zhao et al. | |
| 2010/0102734 A1 | 4/2010 | Quick et al. | |
| 2010/0156952 A1 | 6/2010 | Arai | |
| 2010/0214764 A1 | 8/2010 | Chaves et al. | |
| 2011/0057302 A1 | 3/2011 | Spehar et al. | |
| 2012/0056864 A1 | 3/2012 | Aioanei | |
| 2012/0126711 A1 | 5/2012 | Suminoe et al. | |
| 2012/0147567 A1 | 6/2012 | Lee et al. | |
| 2012/0218754 A1 | 8/2012 | Maes | |
| 2012/0286674 A1 | 11/2012 | Takanashi | |
| 2012/0299480 A1 | 11/2012 | Peting et al. | |
| 2012/0306942 A1 | 12/2012 | Fujiwara et al. | |
| 2013/0057763 A1 | 3/2013 | Cha et al. | |
| 2013/0076250 A1 | 3/2013 | Logiudice | |
| 2013/0114021 A1 | 5/2013 | Illyama et al. | |
| 2013/0169172 A1 | 7/2013 | Kesterson et al. | |
| 2013/0228672 A1 | 9/2013 | Jung et al. | |
| 2014/0028776 A1 | 1/2014 | Kawamura | |
| 2014/0128941 A1 | 5/2014 | Williams | |
| 2014/0152902 A1 | 6/2014 | Morrisseau | |
| 2014/0265919 A1 | 9/2014 | Pope et al. | |
| 2014/0306966 A1 | 10/2014 | Kuo et al. | |
| 2015/0276144 A1 | 10/2015 | Tudhope et al. | |
| 2015/0319814 A1 | 11/2015 | Grotsch et al. | |
| 2015/0348496 A1 | 12/2015 | Santos, II et al. | |

| | | |
|---|---|---|
| 2015/0377695 A1 | 12/2015 | Chang et al. |
| 2016/0071467 A1 | 3/2016 | Elder et al. |
| 2016/0161326 A1 | 6/2016 | Chang et al. |
| 2016/0189605 A1 | 6/2016 | Ahn et al. |
| 2016/0217762 A1 | 7/2016 | Moon et al. |
| 2016/0293811 A1 | 10/2016 | Hussell et al. |
| 2016/0314730 A1 | 10/2016 | Sampsell |
| 2016/0358528 A1 | 12/2016 | Xie et al. |
| 2017/0092198 A1 | 3/2017 | Ryu et al. |
| 2017/0168212 A1 | 6/2017 | Chen et al. |
| 2017/0263828 A1 | 9/2017 | Mao et al. |
| 2017/0294495 A1 | 10/2017 | Shyu et al. |
| 2017/0330509 A1 | 11/2017 | Cok et al. |
| 2017/0330856 A1 | 11/2017 | Zou et al. |
| 2018/0033768 A1 | 2/2018 | Kumar et al. |
| 2018/0035018 A1 | 2/2018 | Yamada et al. |
| 2018/0076368 A1 | 3/2018 | Hussell |
| 2018/0114800 A1 | 4/2018 | Pan |
| 2018/0130441 A1 | 5/2018 | Jeon |
| 2018/0182927 A1 | 6/2018 | Vampola et al. |
| 2018/0247608 A1 | 8/2018 | Chen |
| 2018/0261149 A1 | 9/2018 | Lin |
| 2018/0348959 A1 | 12/2018 | Lin et al. |
| 2019/0132921 A1 | 5/2019 | Rumer |
| 2019/0132923 A1 | 5/2019 | Rumer |
| 2019/0149792 A1 | 5/2019 | Luo et al. |
| 2019/0302917 A1 | 10/2019 | Pan |
| 2019/0335081 A1 | 10/2019 | Baar et al. |
| 2019/0371974 A1 | 12/2019 | Hussell |
| 2020/0105179 A1 | 4/2020 | Greenebaum et al. |
| 2020/0105221 A1 | 4/2020 | Marcu et al. |
| 2020/0135093 A1 | 4/2020 | Prathaban et al. |
| 2020/0184900 A1 | 6/2020 | Shin et al. |
| 2020/0203319 A1 | 6/2020 | Lee et al. |
| 2020/0251050 A1 | 8/2020 | Yee |
| 2020/0309357 A1 | 10/2020 | Hussell et al. |
| 2020/0312220 A1 | 10/2020 | Hussell et al. |
| 2020/0312222 A1 | 10/2020 | Hussell |
| 2020/0312225 A1 | 10/2020 | Hussell |
| 2020/0312226 A1 | 10/2020 | Hussell |
| 2020/0312231 A1 | 10/2020 | Hussell |
| 2020/0335042 A1 | 10/2020 | Son et al. |
| 2021/0005761 A1 | 1/2021 | Tsai et al. |
| 2021/0399183 A1 | 12/2021 | Hussell et al. |
| 2022/0044643 A1 | 2/2022 | Gu et al. |
| 2022/0198989 A1 | 6/2022 | Park et al. |
| 2023/0252934 A1 | 8/2023 | Hussell |

FOREIGN PATENT DOCUMENTS

| | | | |
|---|---|---|---|
| CN | 102483897 A | 5/2012 | |
| CN | 205546092 U | 8/2016 | |
| CN | 207852672 U | 9/2018 | |
| CN | 110782828 A | 2/2020 | |
| EP | 1306827 B1 | 5/2003 | |
| EP | 2400682 A1 | 12/2011 | |
| EP | 2515291 B1 | 11/2016 | |
| JP | 2002229502 A | 8/2002 | |
| JP | 2010091825 A | 4/2010 | |
| JP | 201773411 A | 4/2017 | |
| KR | 1020050111433 A | 11/2005 | |
| KR | 20110082137 A | 7/2011 | |
| WO | 2005048231 A1 | 5/2005 | |
| WO | 2020030993 A1 | 2/2020 | |
| WO | 2021183299 A1 | 9/2021 | |

OTHER PUBLICATIONS

International Search Report and Written Opinion for International Patent Application No. PCT/US2023/061653, mailed Apr. 6, 2023, 24 pages.

Notice of Allowance for U.S. Appl. No. 16/369,003, mailed Mar. 30, 2023, 9 pages.

Advisory Action and Examiner-Initiated Interview Summary for U.S. Appl. No. 16/437,878, mailed Apr. 14. 2023, 4 pages.

Advisory Action and Examiner-Initiated Interview Summary for U.S. Appl. No. 16/543,009, mailed Mar. 28, 2023, 4 pages.

(56) References Cited

OTHER PUBLICATIONS

Notification to Grant for Chinese Patent Application No. 202080025541. 3, mailed Mar. 20, 2024, 6 pages.

Notice of Preliminary Rejection for Korean Patent Application No. 10-2022-7034893, mailed Mar. 7, 2024, 17 pages.

Invitation to Pay Additional Fees and Partial Search for International Patent Application No. PCT/US2024/013657, mailed Apr. 15, 2024, 11 pages.

Written Decision on Registration for Korean Patent Application No. 10-2021-7035365, mailed Mar. 18, 2024, 7 pages.

Advisory Action and Examiner-Initiated Interview Summary for U.S. Appl. No. 18/320,498, mailed May 3, 2024, 4 pages.

Author Unknown, "APA102-2020 Super LED," Datasheet, Shenzhen LED Color Opto Electronic Co., Ltd., retrieved Apr. 10, 2019 from http://www.led-color.com/upload/201604/APA102-2020%20SMD%20LED.pdf, 6 pages.

Author Unknown, "APA102C: RGB Full Color LED control IC," iPixel LED, Shiji Lighting, retrieved Apr. 10, 2019 from https://cdn-shop.adafruit.com/datasheets/APA102.pdf, 5 pages.

Author Unknown, "Self-clocking signal," Jul. 1, 2018, Wikipedia, https://en.wikipedia.org/w/index.php?title=Self-clocking_signal&oldid=848405107, 3 pages.

Author Unknown, "Serial communication," May 2, 2019, Wikipedia, https://en.wikipedia.org/w/index.php? title=Serial_communication&oldid=895110130, 4 pages.

Author Unknown, "SK6812 Technical Data Sheet," Shenzhen LED Color Optoelectronic Co., Ltd., retrieved Apr. 10, 2019 from https://cdn-shop.adafruit.com/product-files/1138/SK6812+LED+datasheet+.pdf, 8 pages.

Author Unknown, "SK6812RGBW Specification: Integrated Light Source Intelligent Control of Chip-On-Top SMD Type LED," Jul. 31, 2015, Dongguang Opsco Optpelectronics Co., Ltd., 16 pages.

Author Unknown, "WS2811: Signal line 256 Gray level 3 channel Constant current LED drive IC," Worldsemi, retrieved May 23, 2019 from https://cdn-shop.adafruit.com/datasheets/WS2811.pdf, 7 pages.

Author Unknown, "WS2812: Intelligent control LED integrated light source," Worldsemi, retrieved Apr. 10, 2019 from https://cdn-shop.adafruit.com/datasheets/WS2811.pdf, 5 pages.

Zhu, K., "EC20-6812 Specification: Embedded Control LED," Dec. 19, 2018, Shenzhen Normand Electronic Co., Ltd., 35 pages.

Invitation to Pay Additional Fees and Partial Search for International Patent Application No. PCT/US2020/023140, mailed Jun. 16, 2020, 25 pages.

International Search Report and Written Opinion for International Patent Application No. PCT/US2020/023140, mailed Aug. 11, 2020, 27 pages.

Non-Final Office Action for U.S. Appl. No. 16/369,003, mailed Aug. 21, 2020, 15 pages.

Non-Final Office Action for U.S. Appl. No. 16/381,116, mailed Aug. 21, 2020, 8 pages.

Non-Final Office Action for U.S. Appl. No. 16/437,878, mailed Aug. 21, 2020, 14 pages.

Non-Final Office Action for U.S. Appl. No. 16/542,923, mailed Aug. 21, 2020, 15 pages.

Reason for Rejection for Japanese Patent Application No. 2021-560354, mailed Oct. 11, 2022, 7 pages.

Invitation to Pay Additional Fees and Partial Search for International Patent Application No. PCT/US2021/019708, mailed May 25, 2021, 17 pages.

International Search Report and Written Opinion for International Patent Application No. PCT/US2021/019708, mailed Jul. 19, 2021, 23 pages.

Final Office Action for U.S. Appl. No. 16/369,003, mailed Dec. 9, 2020, 17 pages.

Advisory Action for U.S. Appl. No. 16/369,003, mailed Feb. 11, 2021, 3 pages.

Non-Final Office Action for U.S. Appl. No. 16/369,003, mailed Apr. 1, 2021, 18 pages.

Final Office Action for U.S. Appl. No. 16/369,003, mailed Jul. 22, 2021, 16 pages.

Advisory Action for U.S. Appl. No. 16/369,003, mailed Sep. 23, 2021, 3 pages.

Non-Final Office Action for U.S. Appl. No. 16/369,003, mailed Nov. 12, 2021, 19 pages.

Final Office Action for U.S. Appl. No. 16/369,003, mailed Mar. 31, 2022, 23 pages.

Non-Final Office Action for U.S. Appl. No. 16/369,003, mailed Jul. 21, 2022, 29 pages.

Final Office Action for U.S. Appl. No. 16/369,003, mailed Nov. 1, 2022, 23 pages.

Final Office Action for U.S. Appl. No. 16/369,003, mailed Nov. 3, 2022, 24 pages.

Final Office Action for U.S. Appl. No. 16/369,003, mailed Dec. 12, 2022, 24 pages.

Final Office Action for U.S. Appl. No. 16/381,116, mailed Dec. 10, 2020, 10 pages.

Advisory Action for U.S. Appl. No. 16/381,116, mailed Feb. 11, 2021, 3 pages.

Non-Final Office Action for U.S. Appl. No. 16/381,116, mailed Apr. 1, 2021, 12 pages.

Final Office Action for U.S. Appl. No. 16/381,116, mailed Jul. 22, 2021, 9 pages.

Non-Final Office Action for U.S. Appl. No. 16/381,116, mailed Nov. 12, 2021, 10 pages.

Final Office Action for U.S. Appl. No. 16/381,116, mailed Mar. 2, 2022, 17 pages.

Advisory Action and Examiner-Initiated Interview Summary for U.S. Appl. No. 16/381,116, mailed May 6, 2022, 4 pages.

Non-Final Office Action for U.S. Appl. No. 16/381,116, mailed Jun. 22, 2022, 17 pages.

Final Office Action for U.S. Appl. No. 16/381,116, mailed Oct. 4, 2022, 17 pages.

Final Office Action for U.S. Appl. No. 16/437,878, mailed Dec. 9, 2020, 14 pages.

Advisory Action and Examiner-Initiated Interview Summary for U.S. Appl. No. 16/437,878, mailed Feb. 11, 2021, 4 pages.

Non-Final Office Action for U.S. Appl. No. 16/437,878, mailed Apr. 1, 2021, 16 pages.

Non-Final Office Action for U.S. Appl. No. 16/437,878, mailed Apr. 23, 2021, 17 pages.

Final Office Action for U.S. Appl. No. 16/437,878, mailed Sep. 1, 2021, 16 pages.

Non-Final Office Action for U.S. Appl. No. 16/437,878, mailed Dec. 15, 2021, 17 pages.

Final Office Action for U.S. Appl. No. 16/437,878, mailed Mar. 31, 2022, 22 pages.

Final Office Action for U.S. Appl. No. 16/437,878, mailed Jul. 21, 2022, 23 pages.

Non-Final Office Action for U.S. Appl. No. 16/437,878, mailed Oct. 27, 2022, 21 pages.

Final Office Action for U.S. Appl. No. 16/542,923, mailed Dec. 10, 2020, 16 pages.

Advisory Action and Examiner-Initiated Interview Summary for U.S. Appl. No. 16/542,923, mailed Feb. 11, 2021, 4 pages.

Non-Final Office Action for U.S. Appl. No. 16/542,923, mailed Apr. 1, 2021, 19 pages.

Non-Final Office Action for U.S. Appl. No. 16/437,878, mailed Jan. 3, 2024, 20 pages.

Final Office Action for U.S. Appl. No. 17/081,522, mailed Dec. 13, 2023, 15 pages.

First Office Action for Chinese Patent Application No. 2020800255413, mailed Oct. 25, 2023, 19 pages.

Author Unknown, "Arri LogC4: Logarithmic Color Space," Specification, first published Jul. 7, 2021, ARRI AG, 20 pages.

Examination Report for European Patent Application No. 21713274. 5, mailed May 28, 2024, 7 pages.

Notice of Reason for Rejection for Japanese Patent Application No. 2023-113594, mailed May 28, 2024, 10 pages.

Notification to Grant for Korean Patent Application No. 10-2022-7034893, mailed Jun. 18, 2024, 5 pages.

(56) References Cited

OTHER PUBLICATIONS

International Search Report and Written Opinion for International Patent Application No. PCT/US2024/013657, mailed Jun. 12, 2024, 17 pages.

Invitation to Pay Additional Fees and Partial Search for International Patent Application No. PCT/US2024/021668, mailed Jul. 5, 2024, 13 pages.

Advisory Action and Examiner-Initiated Interview Summary for U.S. Appl. No. 16/437,878, mailed Jun. 4, 2024, 4 pages.

Non-Final Office Action for U.S. Appl. No. 18/320,498, mailed May 28, 2024, 18 pages.

Notice of Preliminary Rejection for Korean Patent Application No. 10-2024-7018777, mailed Jun. 25, 2024, 19 pages.

Notice of Allowance and Examiner-Initiated Interview Summary for U.S. Appl. No. 16/542,923, mailed Mar. 17, 2023, 11 pages.

Notice of Allowance for U.S. Appl. No. 16/815,101, mailed Feb. 13, 2023, 10 pages.

Non-Final Office Action for U.S. Appl. No. 17/081,522, mailed Mar. 2, 2023, 11 pages.

Notice of Allowance for U.S. Appl. No. 16/906,129, mailed Feb. 27, 2023, 10 pages.

Final Office Action for U.S. Appl. No. 16/437,878, mailed Sep. 19, 2023, 20 pages.

Non-Final Office Action for U.S. Appl. No. 17/081,522, mailed Sep. 13, 2023, 13 pages.

Non-Final Office Action for U.S. Appl. No. 18/065,397, mailed Aug. 28, 2023, 9 pages.

Non-Final Office Action for U.S. Appl. No. 18/298,049, mailed Oct. 5, 2023, 9 pages.

Final Office Action for U.S. Appl. No. 16/542,923, mailed Jul. 22, 2021, 19 pages.

Advisory Action for U.S. Appl. No. 16/542,923, mailed Sep. 23, 2021, 3 pages.

Non-Final Office Action for U.S. Appl. No. 16/542,923, mailed Nov. 12, 2021, 21 pages.

Final Office Action for U.S. Appl. No. 16/542,923, mailed Mar. 2, 2022, 21 pages.

Advisory Action and Examiner-Initiated Interview Summary for U.S. Appl. No. 16/542,923, mailed May 6, 2022, 4 pages.

Non-Final Office Action for U.S. Appl. No. 16/542,923, mailed Jun. 22, 2022, 23 pages.

Final Office Action for U.S. Appl. No. 16/542,923, mailed Oct. 7, 2022, 23 pages.

Final Office Action for U.S. Appl. No. 16/542,923, mailed Nov. 14, 2022, 29 pages.

Advisory Action and Examiner-Initiated Interview Summary for U.S. Appl. No. 16/542,923, mailed Dec. 15, 2022, 4 pages.

Non-Final Office Action for U.S. Appl. No. 16/543,009, mailed Apr. 1, 2021, 14 pages.

Final Office Action for U.S. Appl. No. 16/543,009, mailed Jul. 23, 2021, 15 pages.

Advisory Action for U.S. Appl. No. 16/543,009, mailed Sep. 23, 2021, 3 pages.

Final Office Action for U.S. Appl. No. 16/543,009, mailed Nov. 12, 2021, 15 pages.

Non-Final Office Action for U.S. Appl. No. 16/543,009, mailed Mar. 4, 2022, 15 pages.

Final Office Action for U.S. Appl. No. 16/543,009, mailed Jun. 10, 2022, 16 pages.

Non-Final Office Action for U.S. Appl. No. 16/543,009, mailed Oct. 7, 2022, 16 pages.

Final Office Action for U.S. Appl. No. 16/543,009, mailed Jan. 19, 2023, 19 pages.

Non-Final Office Action for U.S. Appl. No. 16/815,101, mailed Nov. 12, 2021, 13 pages.

Final Office Action for U.S. Appl. No. 16/815,101, mailed Mar. 2, 2022, 14 pages.

Advisory Action and Examiner-Initiated Interview Summary for U.S. Appl. No. 16/815,101, mailed May 6, 2022, 4 pages.

Non-Final Office Action for U.S. Appl. No. 16/815,101, mailed Jun. 22, 2022, 17 pages.

Final Office Action for U.S. Appl. No. 16/815,101, mailed Oct. 7, 2022, 16 pages.

Advisory Action and Examiner-Initiated Interview Summary for U.S. Appl. No. 16/815,101, mailed Dec. 20, 2022, 4 pages.

Ex Parte Quayle Action for U.S. Appl. No. 16/815,101, mailed Jan. 19, 2023, 7 pages.

Non-Final Office Action for U.S. Appl. No. 17/081,522, mailed Jan. 20, 2022, 18 pages.

Final Office Action for U.S. Appl. No. 17/081,522, mailed Apr. 28, 2022, 10 pages.

Advisory Action for U.S. Appl. No. 17/081,522, mailed Jul. 5, 2022, 3 pages.

Non-Final Office Action for U.S. Appl. No. 17/081,522, mailed Aug. 17, 2022, 9 pages.

Final Office Action for U.S. Appl. No. 17/081,522, mailed Nov. 10, 2022, 10 pages.

Advisory Action and Examiner-Initiated Interview Summary for U.S. Appl. No. 17/081,522, mailed Jan. 23, 2023, 4 pages.

Non-Final Office Action for U.S. Appl. No. 16/906,129, mailed Jun. 9, 2022, 14 pages.

Final Office Action for U.S. Appl. No. 16/906,129, mailed Dec. 12, 2022, 15 pages.

Decision to Grant for Japanese Patent Application No. 2022-554701, mailed Feb. 20, 2024, 6 pages.

International Search Report and Written Opinion for International Patent Application No. PCT/US2023/079460, mailed Feb. 23, 2024, 16 pages.

Final Office Action for U.S. Appl. No. 16/437,878, mailed Apr. 5, 2024, 21 pages.

Final Office Action for U.S. Appl. No. 18/320,498, mailed Feb. 27, 2024, 14 pages.

Notice of Allowance for U.S. Appl. No. 17/081,522, mailed Apr. 5, 2024, 8 pages.

Notice of Allowance for U.S. Appl. No. 18/298,049, mailed Feb. 2, 2024, 9 pages.

Advisory Action and Examiner-Initiated Interview Summary for U.S. Appl. No. 17/081,522, mailed Feb. 16, 2024, 5 pages.

Non-Final Office Action for U.S. Appl. No. 16/437,878, mailed May 31, 2023, 19 pages.

Notice of Allowance for U.S. Appl. No. 16/543,009, mailed May 24, 2023, 10 pages.

Final Office Action for U.S. Appl. No. 17/081,522, mailed Jun. 7, 2023, 11 pages.

Examination Report for European Patent Application No. 20718953. 1, mailed Jul. 6, 2023, 11 pages.

Decision to Grant for Japanese Patent Application No. 2023-113594, mailed Nov. 7, 2024, 5 pages.

Decision on Appeal for U.S. Appl. No. 16/381,116, mailed Sep. 23, 2024, 14 pages.

Advisory Action for U.S. Appl. No. 18/320,498, mailed Nov. 6, 2024, 4 pages.

Non-Final Office Action for U.S. Appl. No. 18/655,639, mailed Nov. 22, 2024, 10 pages.

Notice of Reason for Rejection for Japanese Patent Application No. 2022-554701, mailed Sep. 19, 2023, 11 pages.

Advisory Action for U.S. Appl. No. 16/437,878, mailed Nov. 28, 2023, 3 pages.

Non-Final Office Action for U.S. Appl. No. 18/320,498, mailed Dec. 6, 2023, 12 pages.

International Search Report and Written Opinion for International Patent Application No. PCT/US2024/021668, mailed Aug. 26, 2024, 20 pages.

Notice of Allowance for U.S. Appl. No. 16/437,878, mailed Jul. 29, 2024, 11 pages.

Final Office Action for U.S. Appl. No. 18/320,498, mailed Sep. 6, 2024, 21 pages.

* cited by examiner

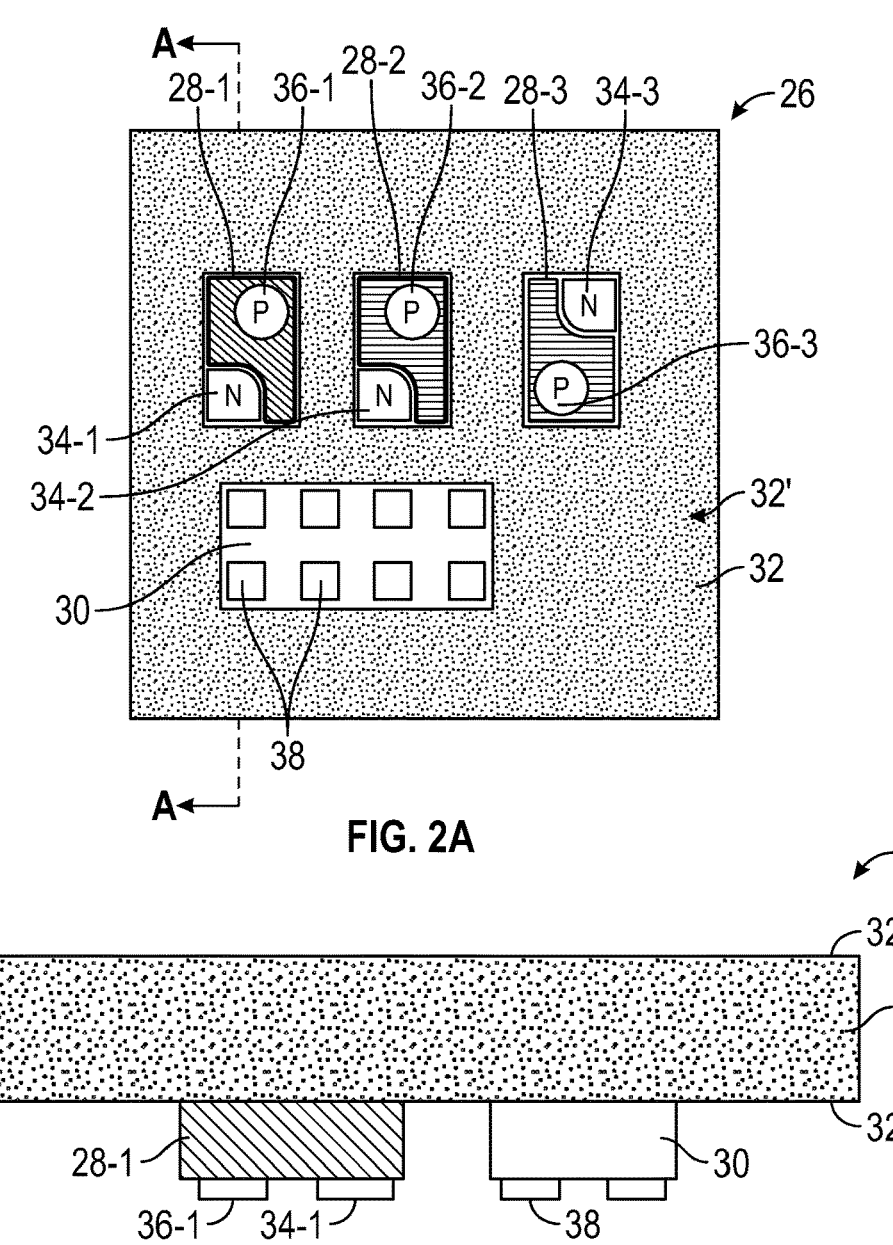
FIG. 2A
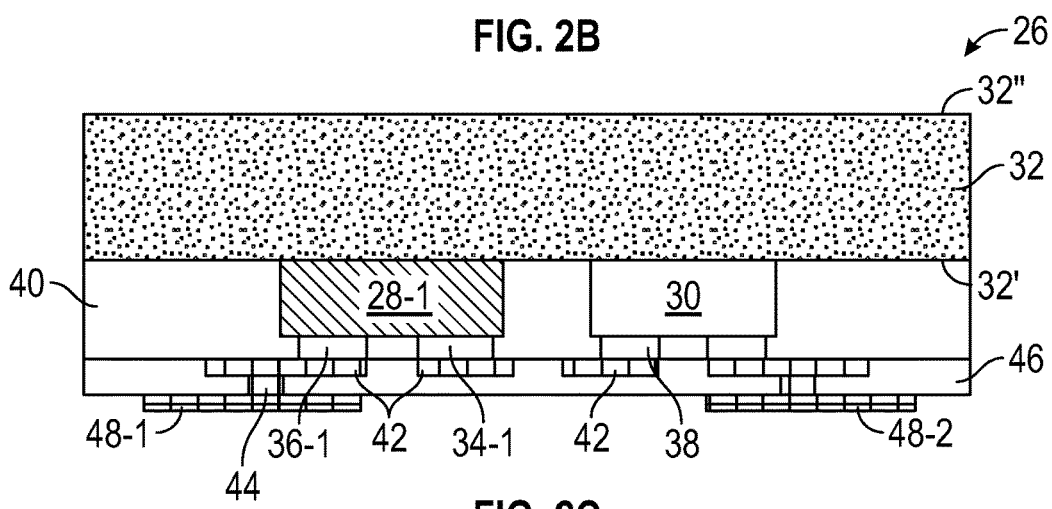
FIG. 2B
FIG. 2C

ERROR DETECTION IN LED PACKAGES

FIELD OF THE DISCLOSURE

The present disclosure relates to lighting devices including light-emitting diode (LED) packages, and more particularly to error detection in LED packages.

BACKGROUND

Light-emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions.

LEDs have been widely adopted in various illumination contexts, for backlighting of liquid crystal display (LCD) systems (e.g., as a substitute for cold cathode fluorescent lamps), and for direct-view LED displays. Applications utilizing LED arrays include vehicular headlamps, roadway illumination, light fixtures, and various indoor, outdoor, and specialty contexts. Desirable characteristics of LED devices include high luminous efficacy, and long lifetime.

Conventional LCD systems require polarizers and color filters (e.g., red, green, and blue) that inherently reduce light utilization efficiency. Direct-view LED displays, which utilize self-emitting LEDs that dispense with the need for backlights, polarizers, and color filters, provide enhanced light utilization efficiency.

Large format multi-color direct-view LED displays (including full color LED video screens) typically include numerous individual LED panels, packages, and/or components providing image resolution determined by the distance between adjacent pixels or "pixel pitch." Direct-view LED displays typically include three-color displays with arrayed red, green, and blue (RGB) LEDs, and two-color displays with arrayed red and green (RG) LEDs. Other colors and combinations of colors may be used. For many LED display systems, it is desirable to form LED color groups for each pixel such as primary colors red, green, and blue (RGB) that define vertices of a triangle (or polygon) on a chromaticity diagram. This polygon defines the so-called color gamut of the display device, the area of which describes all the possible colors that the display device is capable of producing. Wider color gamut describes the capability of producing more colors than a display device having a narrower color gamut. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full-color pixel. Medium-sized displays with relatively smaller viewing distances require smaller pixel pitches (e.g., 3 mm or less), and may include panels with arrayed red, green, and blue LED components mounted on a single electronic device attached to a driver printed circuit board that controls the LEDs. Driver printed circuit boards are typically densely populated with electrical devices including capacitors, field effect transistors (FETs), decoders, microcontrollers, and the like for driving the pixels of the display. As pixel pitches continue to decrease for higher resolution displays, the density of such electrical devices scales higher corresponding to the increased number of pixels for a given panel area. This tends to add higher complexity and costs to LED panels for display applications.

The art continues to seek improved LED array devices with small pixel pitches while overcoming limitations associated with conventional devices and production methods.

SUMMARY

The present disclosure relates to lighting devices including light-emitting diode (LED) packages, and more particularly to error detection in LED packages. LED packages are disclosed that are arranged for cascade communication and active matrix addressing as part of a larger LED display such that each LED package may form an LED pixel or a grouping of LED pixels of the LED display. A separate active electrical element is integrated with each LED package for facilitating active matrix addressing from a data stream, checking input error detection codes, and generating new output error detection codes to the data stream. The active electrical element within each LED package is separately capable of changing one or more portions of received data in the data stream, transmitting the changed data to the next downstream LED package, and generating the output error detection codes based on the changed data. When the active electrical element identifies corrupted data based on input error detection codes, the generated output error detection codes may be intentionally corrupted so downstream LED packages will also identify the respective data as being corrupted.

In one aspect, an LED package comprises: at least one LED chip; and an active electrical element electrically connected to the at least one LED chip, the active electrical element configured to: receive a data block and an input error detection code from a communication channel; change at least one portion of the data block; and generate an output error detection code that replaces the input error detection code, the output error detection code corresponding to the at least one portion of the data block that is changed. In certain embodiments, the active electrical element comprises logic to provide the output error detection code as a corrupt output error detection code. In certain embodiments, the active electrical element is configured to identify data corruption of the data block and provide the output error detection code as a corrupt output error detection code so that the data corruption is identified by other elements arranged to receive the corrupt output error detection code. In certain embodiments, the active electrical element is configured to generate a calculated error detection code based on the data block and the at least one portion of the data block that is changed and invert a value of a last bit of the calculated error detection code to generate the corrupt output error detection code.

In certain embodiments, the input error detection code is an input cyclic redundancy check (CRC) and the output error detection code is an output CRC. In certain embodiments, the active electrical element comprises a CRC decoder configured to receive the input CRC and a CRC encoder configured to generate the output CRC. In certain embodiments, the active electrical element comprises a first bidirectional communication port and a second bidirectional communication port. In certain embodiments, the active electrical element is configured to detect an input signal at the first bidirectional communication port, assign the first bidirectional communication port as an input port, and assign the second bidirectional communication port as an output port.

The LED package may further comprise: a submount on which the at least one LED chip and the active electrical element are mounted; an encapsulant layer on the submount and on portions of the least one LED chip and the active electrical element; and package bond pads electrically coupled to the at least one LED chip and the active electrical element.

In another aspect, an LED package comprises: at least one LED chip; and an active electrical element electrically connected to the at least one LED chip, the active electrical element configured to: receive an input error detection code from a communication channel; generate a corrupt output error detection code; and send the corrupt output error detection code along the communication channel or to another communication channel. In certain embodiments, the input error detection code is an input cyclic redundancy check (CRC) and the corrupt output error detection code is a corrupt output CRC. In certain embodiments, the active electrical element further comprises a CRC encoder, a CRC decoder, and a CRC corrupter that receives a data block from the communication channel and identifies data corruption of the data block in order to generate the corrupt output CRC. In certain embodiments, the active electrical element is further configured to change at least one portion of the data block as the data block passes through the active electrical element and return the data block that is changed to the communication channel or another communication channel in order to generate the corrupt output CRC. In certain embodiments, the active electrical element is configured to generate a calculated CRC based on the input CRC and the at least one portion of the data block that is changed and invert a value of a last bit of the calculated CRC to generate the corrupt output CRC. In certain embodiments, the active electrical element comprises a first bidirectional communication port and a second bidirectional communication port. The LED package may further comprise: a submount on which the at least one LED chip and the active electrical element are mounted; an encapsulant layer on the submount and on portions of the at least one LED chip and the active electrical element; and package bond pads electrically coupled to the at least one LED chip and the active electrical element.

In another aspect, an LED package comprises: at least one LED chip; and an active electrical element electrically connected to the at least one LED chip, the active electrical element configured to: receive an input error detection code from a communication channel; generate a calculated error detection code based on the input error detection code; and invert a last bit of the calculated error detection code to generate an output error detection code. In certain embodiments, the input error detection code is an input cyclic redundancy check (CRC), the calculated error detection code is a calculated CRC, and the output error detection code is an output CRC. In certain embodiments, the active electrical element is configured to transmit the output CRC to the communication channel or to another communication channel. In certain embodiments, the active electrical element is configured to receive a data block from the communication channel and identify data corruption of the data block in order to generate the output CRC. In certain embodiments, the active electrical element is further configured to change at least one portion of the data block that the active electrical element transmits to the communication channel or to another communication channel. In certain embodiments, the active electrical element comprises a first bidirectional communication port and a second bidirectional communication port. The LED package may further comprise: a submount on which the at least one LED chip and the active electrical element are mounted; an encapsulant layer on the submount and on portions of the at least one LED chip and the active electrical element; and package bond pads electrically coupled to the at least one LED chip and the active electrical element.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2A is a bottom view of an LED package that may represent one of the LED pixels of FIG. 1A at a fabrication step where LEDs and an active electrical element are mounted on a submount.

FIG. 2B is a cross-sectional view taken along the section line A-A of FIG. 2A.

FIG. 2C is a cross-sectional view of the LED package of FIG. 2B at a subsequent fabrication step where an encapsulant layer and various electrical connections are formed.

DETAILED DESCRIPTION

Figure 1A:
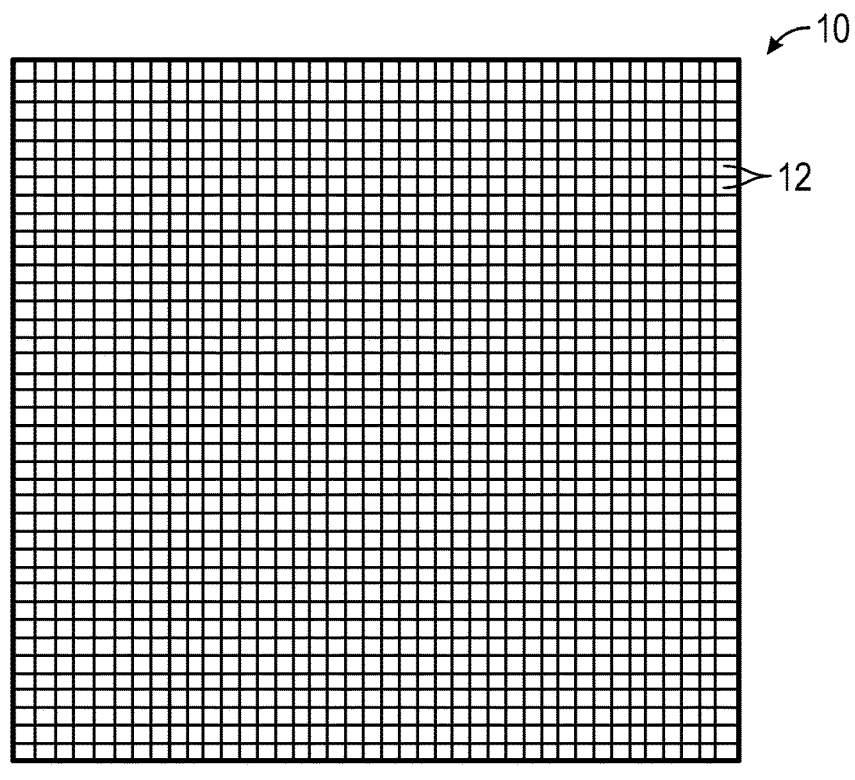
FIG. 1A is a top view of a front face of a representative display panel for a light-emitting diode (LED) display that includes a plurality of active LED pixels.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to lighting devices including light-emitting diode (LED) packages, and more particularly to error detection in LED packages. LED packages are disclosed that are arranged for cascade communication and active matrix addressing as part of a larger LED display such that each LED package may form an LED pixel or a grouping of LED pixels of the LED display. A separate active electrical element is integrated with each LED package for facilitating active matrix addressing from a communication channel, checking input error detection codes, and generating new output error detection codes. The active electrical element within each LED package is separately capable of changing one or more portions of received data, transmitting the changed data to the next downstream LED package or other receiving element, and generating the output error detection codes based on the changed data. When the active electrical element identifies corrupted data based on input error detection codes, the generated output error detection codes may be intentionally corrupted so downstream LED packages will also identify the respective data as being corrupted.

As used herein, the terms "data stream" and "communication channel" may at times be used interchangeably. However, a "data stream" generally refers to a non-physical representation of data over time that flows through a set of at least one communication channel as well as the internal wiring and storage registers within various elements such as controllers and active electrical elements. A "communication channel" generally refers to a physical medium through which the data stream is conveyed. For example, a communication channel may comprise a wire with associated electrical elements, an optical fiber, or even air as in the case of radio, light, or sound waves. A given physical channel could also be divided up in time or frequencies to allow multiple "communication channels" within one medium at once such as changing to a different frequency band. In certain aspects, communication channels may embody serial digital communication channels. Certain aspects relate to a binary communication channel that is a single wire which commonly can only hold one value at a time which is high or low voltage (e.g., digital "0" or "1") and is controlled by the output register of preceding device.

The present disclosure relates to light-emitting devices including LEDs, LED packages, and related LED displays, and more particularly to active control of LEDs within LED displays. LED displays may include rows and columns of LEDs that form an array of LED pixels. A particular LED pixel may include a cluster of LED chips of the same color or multiple colors, with an exemplary LED pixel including a red LED chip, a green LED chip, and a blue LED chip. In certain embodiments, an LED package includes a plurality of LED chips that form at least one LED pixel, and a plurality of such LED packages may be arranged to form an array of LED pixels for an LED display. Each LED package may include its own active electrical element that is configured to receive a control signal and actively maintain an operating state, such as brightness or grey level, or a color select signal for the LED chips of the LED device while other LED devices are being addressed. In certain embodiments, the active electrical element may include active circuitry that includes one or more of a driver device, a signal conditioning or transformation device, a memory device, a decoder device, an electrostatic discharge (ESD) protection device, a thermal management device, and a detection device, among others. In this regard, each LED pixel of an LED display may be configured for operation with active matrix addressing. The active electrical element may be configured to receive one or more of an analog control signal, an encoded analog control signal, a digital control signal, and an encoded digital control signal. In such arrangements, strings of LED packages, each with their own active electrical element, may be arranged for serial communication where each active element receives data from a data stream and transmits data to the next active electrical element in the string of LED packages.

According to embodiments of the present disclosure, arrangements of LED chips and active electrical elements are provided, thereby providing LED chips in close proximity with corresponding active electrical elements within a larger LED array. In this manner, individual LED pixels of a larger display may be configured for operation with appropriate communication signals, including but not limited to active matrix addressing. Further details regarding active control of LEDs and corresponding LED pixels are disclosed in U.S. patent application Ser. No. 16/815,101 titled "Active Control of Light Emitting Diodes and Light Emitting Diode Displays," published as U.S. 2020/0312231 A1, with the entire contents thereof being hereby incorporated by reference herein.

As used herein, a layer or region of a light-emitting device or package may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides of the LED chip. A lateral geometry LED chip typically includes both anode and cathode connections on the same side of the LED chip that is opposite a substrate, such as a growth substrate. Certain embodiments disclosed herein relate to the use of flip chip LED devices in which a light transmissive substrate represents an exposed light-emitting surface.

LED packages that include one or more LED chips can be arranged in many different applications to provide illumination of objects, surfaces, or areas. In certain applications, clusters of differently colored LED chips or LED packages may be arranged as pixels for LED display applications, including video displays. For example, individual clusters of red, green, and blue LED chips within LED packages may form LED pixels of a larger LED display. In certain applications, the red, green, and blue LED chips of each pixel may be packaged together as a multiple-LED package and the LED display is formed when arrays of such multiple-LED packages are arranged together. In this regard, each pixel may include a single LED package that includes a red LED chip, a green LED chip, and a blue LED chip. In other embodiments, the red, green, and blue LED chips may be separately packaged or arranged in a chip-on-board configuration. In certain LED display applications, arrays of LED pixels are arranged on panels, which may also be referred to as tiles or LED modules, and arrays of such panels are arranged together to form larger LED displays. Depending on the application, each panel of an LED display may include different numbers of LED pixels. In certain applications, each panel of an LED display may include an array formed by 64 rows by 64 columns of LED pixels or more. In certain embodiments, each panel of an LED display may be configured with a horizontal display resolution of about 4,000 LED pixels, or 4K resolution. For applications where higher screen resolution is desired for LED displays, each panel may include even more rows and columns of LED pixels that are more closely spaced to one another. Depending on the desired screen resolution, pixel pitches may be about 3 millimeters (mm), or about 2.5 mm, or about 1.6 mm, or in a range from about 1.5 mm to about 3 mm, or in a range from about 1.6 mm to about 3 mm, or in a range from about 1.5 mm to about 2.5 mm. Additionally, for fine pitch LED displays with even higher screen resolutions, pixel pitches may be configured to be less than 1 mm, or less than 0.8 mm, or in a range from about 0.5 mm to about 1 mm, or about 0.7 mm for certain embodiments.

In conventional video display applications, the LED pixels are typically configured for passive matrix addressing. As used herein, the term "passive" refers to the lack of a dedicated driver element for each LED pixel, sub-pixel or LED chip. In this manner, passive LED pixels may be arranged for coupling to an interface element that provides electrical connections to a separate driver or controller that is shared among several LED pixels. For example, orthogonally arranged (e.g., vertical and horizontal) conductors form rows and columns in a grid pattern, whereby individual LED chips of each LED pixel are defined by each intersection of a row and column. Multiplex sequencing may be used to permit individual control of each LED chip of the array while employing a smaller number of drivers and conductor traces than the number of LED chips in the array, either by utilizing a common-row anode or common-row cathode matrix arrangement, and brightness control may be provided by pulse width modulation (PWM). In this manner, drivers and conductors for rows or columns are shared among many LED pixels and time division multiplexing is employed to address each individual LED pixel. Due to this shared-driver configuration, each LED pixel only emits light within their respective communication times. The separate drivers for controlling the display are typically arranged remotely from the pixels of the display, such as on a separate board or module, or on a printed circuit board (PCB) that is attached or otherwise mounted to the backside of each panel, or within separate component packages mounted on the backside of a common PCB that includes an array of pixels on the frontside. The common PCBs are typically densely populated with electrical devices including capacitors, field effect transistors (FETs), decoders, microcontrollers, and the like for driving each of the pixels on a particular panel. For higher resolution displays, the density of such electrical devices scales higher corresponding to the increased number of pixels on each panel. This can add higher complexity and costs to LED panels for display applications as well as increase thermal crowding in areas where driver electronics are more closely spaced. For passive matrix addressing, the LED pixels are typically driven by pulsed signal sequences. In this regard, the LED pixels may pulse rapidly at certain frequencies, such as 60 hertz (Hz) or 120 Hz depending on the display scan rate. While the video display may not appear to be rapidly pulsing to a human eye, it may be detectable with image capture equipment, and in some instances, a beating effect can be observed between the video display and other pulsed displays, light sources, or image capture equipment.

According to embodiments disclosed herein, each LED pixel of an LED display may be configured for operation with active matrix addressing. For active matrix addressing, each LED pixel is configured to actively maintain an operating state or otherwise control the driving state, such as brightness or grey level, or color select, while other LED pixels are being addressed, thereby allowing each LED pixel to maintain or otherwise independently control their driving state and provide improved viewing and/or image recording by reducing or eliminating effects caused by lower-frequency pulsing beating with aforementioned equipment (e.g., lighting sources, other pulsed displays, or image capture equipment). Accordingly, each LED pixel may be configured to hold its respective operating state with a continuous drive signal, inclusive of pulse-width modulation, rather than by time division multiplexed signals that result in the addition of low frequency components to the drive signals associated with passive matrix addressing. In this regard, each LED pixel may include an active electrical chip or an active electrical element that may include a memory device and the ability to alter a driving condition of the LED pixel based on a state stored in the memory of the active electrical element. In certain embodiments, the continuous drive signal is a constant analog drive current, and in other embodiments where the brightness level may be controlled by pulsed methods such as PWM, the continuous drive signal may refer to a PWM signal that is not interrupted by the time division multiplexed scanning of other LED pixels within the array or within a sub-array. In certain embodiments, the active electrical element may include active circuitry that includes one or more of a driver device, a signal conditioning or transformation device, a memory device, a decoder device, an ESD protection device, a thermal management device, a detection device, and a voltage and/or current sensing device, a command processing device, and circuitry, among others. In various embodiments, an active electrical element comprises an integrated circuit chip, an application-specific integrated circuit (ASIC), a microcontroller, or a field-programmable gate array (FPGA). In certain embodiments, active electrical elements may be configured to be programmable or reprogrammable after they are manufactured through various memory elements and logic that are incorporated within the active electrical elements.

As used herein, the term "active electrical chip," "active electrical element," or "active electrical component" includes any chip or component that is able to alter a driving condition of an LED based on memory or other information that may be stored within a chip or component. As used herein, the terms "active LED pixel" and "smart LED pixel" may be used interchangeably and may refer to a device that includes one or more LED devices or chips that form a pixel and an active electrical element or chip as described above. In certain embodiments, each LED pixel may comprise a single LED package that is configured as an active LED package that includes multiple LED chips and an active electrical element as described above. In this manner, the number of separate electrical devices needed for the LED display may be reduced, such as the separate electrical devices located on the backsides of LED panels of the LED display as previously described. Additionally, overall operating powers needed to run the LED panels may be reduced.

In digital communication and networks, error detection codes are commonly used to detect data errors and/or corrupted data transmitted along communication channels due to various factors, such as channel noise during transmission. In general, a sending device, such as a server or master controller, may incorporate error detection codes in a data stream and a receiving device is able to check for any errors of the received error detection codes. During communication, the sending and receiving devices may constantly be sending and checking error detection codes to verify data integrity. A certain type of error detection code is a cyclic redundancy check (CRC). Other types of error detection codes include parity bits and checksum, among others.

According to principles of the present disclosure, LED packages or LED pixels are arranged for active matrix addressing and are capable of checking input error detection codes and generating new output error detection codes for output into same or additional communication channels. Each LED package is separately capable of changing one or more portions of received data and transmitting the changed data to the next downstream LED package or other receiving element. When the LED package changes data, the LED package generates a new output error detection code that corresponds with the changed data. In some instances, the LED package may detect an error with the input error detection code and then generate a new output error detection code that is intentionally corrupted to notify other LED packages of corrupted data. Since the LED package is changing the output error detection code to reflect the changed data, intentionally corrupting the output error detection code may avoid the LED package inadvertently correcting the error determined by the input error detection code such that downstream LED packages will otherwise not be able to determine that the original data had been corrupted. The following embodiments will be discussed in the context of CRCs; however, the principles discussed are applicable to any type of error detection codes.

FIG. 1A is a top view of a front face of a representative display panel 10 for an LED display that includes a plurality of active LED pixels 12. As illustrated, the plurality of active LED pixels 12 may be arranged in rows and columns to form an array of active LED pixels 12 across the front face of the display panel 10. In certain embodiments, each active LED pixel 12 is configured with an active electrical element that includes the ability to receive an input signal, store a memory based on the input signal, alter a driving condition of LEDs within the active LED pixel 12 based on the data stored in memory, and update the driving condition each time the memory is updated by the input signal or other internal element. In certain embodiments, each active LED pixel 12 comprises an individual LED package that includes the active electrical element and a plurality of LED chips.

Figure 1B:
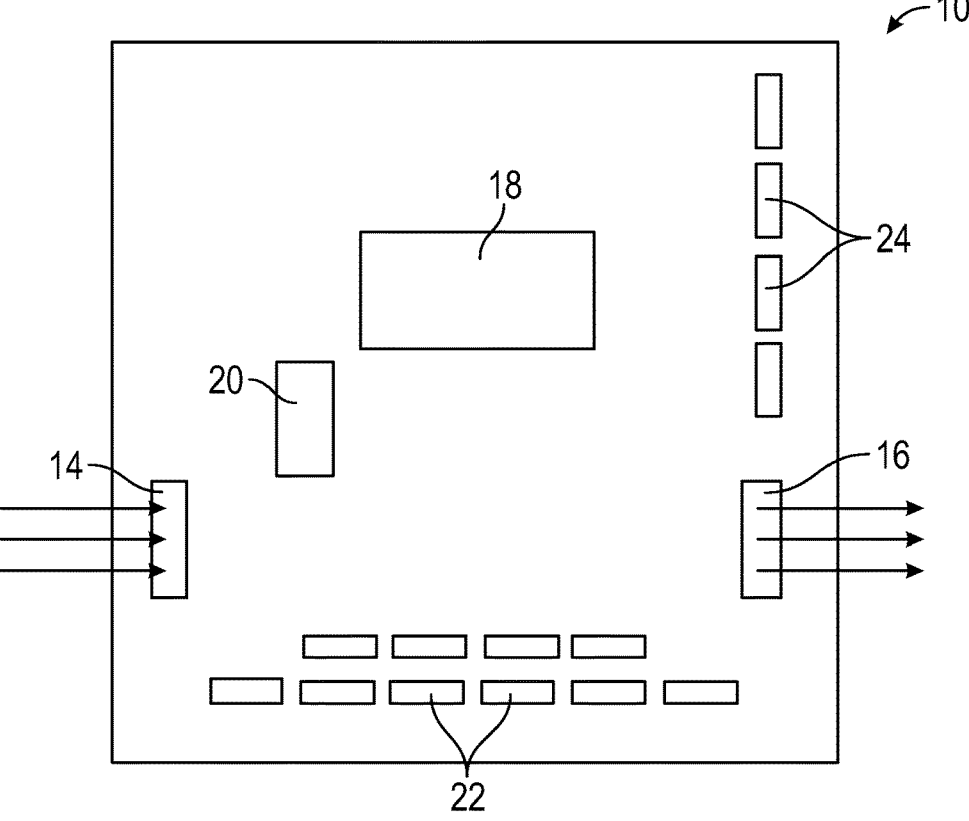
FIG. 1B is a bottom view of a back face of the representative display panel of FIG. 1A.

FIG. 1B is a bottom view of a back face of the representative display panel 10 of FIG. 1A. All illustrated, the display panel 10 may include additional passive or active elements that are configured to receive, process, and distribute signals and power to the active LED pixels 12 of FIG. 1A. For example, the display panel 10 may include an input signal connector 14 and an output signal connector 16, each of which may be configured as a video source connector, including a video graphics array (VGA) connector, a digital visual interface (DVI) connector, a high-definition multimedia interface (HDMI) connector, or a DisplayPort connector, among others. The input and output signal connectors 14, 16 may alternatively be configured as data network connectors such as universal serial bus (USB) or ethernet, among others. The display panel 10 may comprise a control element 18 that includes control circuitry, such as a semiconductor control element. The control element 18 may be configured to receive an input signal via the input signal connector 14 and output control signals for the active LED pixels. As will later be described in more detail, the active electrical element of each LED pixel is configured to independently alter a driving condition of each LED chip within the LED pixel in response to the control signals that are received from the control element 18. In certain embodiments, the control element 18 comprises an integrated circuit, such as one or more of an ASIC, a microcontroller, a programmable control element, and a FPGA. In certain embodiments, a plurality of control elements 18 may be configured on or registered with each display panel 10. A decoder element 20 may be configured to receive, decode, and route the signals between the input and output signal connectors 14, 16 and the control element 18. In certain embodiments, passive elements 22 such as resistors, capacitors, and inductors may be provided to maintain proper power and signal levels throughout the system. The display panel 10 may also include other passive or active elements 24, which may include additional decoders, resistors, capacitors, or other electrical elements or circuits for video displays. In this manner, the signal connectors 14 and 16, the control element 18, the decoder element 20, the passive elements 22, and the other passive or active elements 24 are registered with the display panel 10. In alternative embodiments, the back face of the display panel 10 may comprise another plurality of LED packages that form another array of LED pixels. In this regard, the display panel 10 may be configured for a double-sided display application. In such embodiments, at least some of the signal connectors 14 and 16, the control element 18, the decoder element 20, the passive elements 22, and the other passive or active elements 24 may be registered with the display panel 10 in locations other than the back face in configurations to provide control signals from one or more edges of the display panel 10 or from within the display panel 10 itself.

FIGS. 2A-2E illustrate various states of fabrication for an LED package 26 that includes a plurality of LEDs 28-1 to 28-3 and an active electrical element 30 according to embodiments disclosed herein. Certain aspects are discussed in the context of three LED chips 28-1 to 28-3, such as a red LED chip, a green LED chip, and a blue LED chip to form an LED pixel of a display. Other aspects may relate to LED packages that include at least one LED chip up to any number of LED chips housed with the active electrical element 30 within a common LED package. The active electrical element 30 may also be referred to as an active electrical chip or an active electrical component. The LED package 26 of FIGS. 2A-2E is provided as an exemplary form of an individual one of the LED pixels 12 of FIG. 1A. It is contemplated that other LED package structures that include one or more LED chips and the active electrical element as described herein may also be implemented as an individual LED pixel of a larger LED display according to principles of the present disclosure.

FIG. 2A is a bottom view of the LED package 26 at a particular state of fabrication where the plurality of LEDs 28-1 to 28-3 and the active electrical element 30 are mounted on a submount 32. In particular, the plurality of LEDs 28-1 to 28-3 and the active electrical element 30 may be mounted on a first face 32' of the submount 32. A light transmissive die attach material may be arranged between the plurality of LEDs 28-1 to 28-3 and the submount 32 to facilitate mounting. Each of the plurality of LEDs 28-1 to 28-3 may include a corresponding cathode contact 34-1 to 34-3 (e.g., an n-type contact pad) and a corresponding anode contact 36-1 to 36-3 (e.g., a p-type contact pad). In certain embodiments, the plurality of LEDs 28-1 to 28-3 comprise individual LED chips that generate different wavelengths of light. For example, the LED 28-1 may be configured to generate predominantly green emissions, the LED 28-2 may be configured to generate predominantly blue emissions, and the LED 28-3 may be configured to generate predominantly red emissions. Accordingly, the plurality of LEDs 28-1 to 28-3 may comprise a green LED chip, a blue LED chip, and a red LED chip. In other embodiments, different combinations of colors and numbers of LEDs are possible. In still further embodiments, each of the plurality of LEDs 28-1 to 28-3 may be configured to generate light emissions that are predominantly the same as one another. In other embodiments, the plurality of LEDs 28-1 to 28-3 may comprise a micro-LED structure where a common active LED structure is segregated into a plurality of active LED structure portions to form the plurality of LEDs 28-1 to 28-3 that may be independently addressable from one another.

In certain embodiments, the active electrical element 30 is configured to receive a signal or a plurality of signals and independently drive each LED of the plurality of LEDs 28-1 to 28-3. In certain embodiments, the active electrical element 30 includes a memory element, chip, or component that is configured to store one or more operating states for the plurality of LEDs 28-1 to 28-3 that are received from an external source, such as the control element 18 of FIG. 1B. The active electrical element 30 may further be configured to alter one or more driving conditions of the plurality of LEDs 28-1 to 28-3 based on the one or more stored operating states. In certain embodiments, the active electrical element 30 is configured to independently alter a driving condition of each LED of the plurality of LEDs 28-1 to 28-3 based on a plurality of operating states that are stored by the memory element. In this regard, the active electrical element 30 may be configured to receive and store one or more operating states and independently drive each LED of the plurality of LEDs 28-1 to 28-3 according to one or more operating states. The active electrical element 30 may continue to drive and maintain the operating state for each LED of the plurality of LEDs 28-1 to 28-3 until the active electrical element 30 receives refreshed or updated signals that correspond to updated operating states. In this manner, the active electrical element 30 may be configured to alter a driving condition of the plurality of LEDs 28-1 to 28-3 according to a temporarily stored operating state of the memory element. Accordingly, the plurality of LEDs 28-1 to 28-3 may be configured for active matrix addressing as previously described.

In order to rapidly receive one or more operating states for the plurality of LEDs 28-1 to 28-3, the active electrical element 30 may include a plurality of contact pads 38. In certain embodiments, certain contact pads of the plurality of contact pads 38 are configured to receive one or more signals, and other contact pads of the plurality of contact pads 38 are configured to send signals to independently drive or address the plurality of LEDs 28-1 to 28-3. In certain embodiments, the active electrical element 30 comprises one or more of an integrated circuit chip, an ASIC, a microcontroller, or a FPGA. In certain embodiments, the active electrical element 30 may be configured to be programmable or reprogrammable after it is manufactured through various memory elements and logic that are incorporated within the active electrical element 30. In this regard, the active electrical element 30 may be considered programmable for embodiments where the active electrical element 30 does not include a FPGA.

The submount 32 can be formed of many different materials with a preferred material being electrically insulating. Suitable materials include but are not limited to ceramic materials such as aluminum oxide or alumina, AlN, or organic insulators like polyimide (PI) and polyphthalamide (PPA). In other embodiments, the submount 32 can comprise a PCB, glass, sapphire, Si, epoxy, silicone, or any other suitable material. For PCB embodiments, different PCB types can be used such as standard FR-4 PCB, bismaleimide-triazine (BT) or related materials, metal core PCB, or any other type of PCB. In certain embodiments, the submount 32 comprises a light-transmissive material such that light emissions from the plurality of LEDs 28-1 to 28-3 may pass through the submount 32. In this regard, a light-emitting face of each of the plurality of LEDs 28-1 to 28-3 may be mounted to the submount 32. Suitable light-transmissive materials for the submount 32 include glass, sapphire, epoxy, and silicone. In certain embodiments where the submount 32 is a light-transmissive submount, the submount 32 may be referred to as a superstrate. The term "superstrate" is used herein, in part, to avoid confusion with other substrates that may be part of the semiconductor light-emitting device, such as a growth or carrier substrate of an LED chip or a different submount for the LED package 26. The term "superstrate" is not intended to limit the orientation, location, and/or composition of the structure it describes. In certain embodiments, the submount 32 may comprise a light-transmissive superstrate and the LED package 26 may be devoid of another submount. In other embodiments, the submount 32 may comprise a light-transmissive superstrate and the LED package 26 comprises an additional submount, wherein the plurality of LEDs 28-1 to 28-3 are arranged between the submount 32 and the additional submount.

FIG. 2B is a cross-sectional view of the LED package 26 taken along the section line A-A of FIG. 2A. As illustrated, the LED 28-1 and the active electrical element 30 are mounted to separate portions of the first face 32' of the submount 32. Accordingly, emissions from the LED 28-1 may be configured to pass through the submount 32 such that a second face 32" of the submount 32 is configured as a primary emission face of the LED package 26. Notably, the anode contact 36-1 and the cathode contact 34-1 of the LED 28-1 are arranged on an opposite side of the LED 28-1 relative to the submount 32. In this regard, light emissions from the LED 28-1 may pass through the submount 32 and out of the opposite face 32" without interacting or being absorbed by the anode contact 36-1 and the cathode contact 34-1. Additionally, the contact pads 38 of the active electrical element may also be arranged in a spaced manner from the first face 32' so that all electrical connections are provided in a spaced manner from the primary emission face, i.e., the second face 32". The orientation of the cross-sectional view in FIG. 2B is intended to illustrate that the second face 32" of the submount 32 will be configured as the primary light emission face; however, during intermediate fabrication steps, the orientation of FIG. 2B and subsequent cross-sectional fabrication views may be rotated 180 degrees such that the LED 28-1 is assembled sequentially above the submount 32.

FIG. 2C is a cross-sectional view of the LED package 26 of FIG. 2B at a subsequent fabrication step where an encapsulant layer 40 and various electrical connections are formed. The encapsulant layer 40 may be blanket deposited to cover the plurality of LEDs 28-1 to 28-3 and the active electrical element 30 with the contact pads 38 and the cathode and anode contacts 36-1, 34-1 being accessible through the encapsulant layer 40. The encapsulant layer 40 may surround perimeter or lateral edges of each LED of the plurality of LEDs 28-1 to 28-3, and the encapsulant layer 40 may also cover at least a portion of a bottom surface of each LED of the plurality of LEDs 28-1 to 28-3. The encapsulant layer 40 may surround the perimeter or lateral edges and bottom surfaces of the active electrical element 30. For example, a removal step may be subsequently applied to the encapsulant layer 40 such that a portion of the encapsulant layer 40 is removed to form exposed surfaces for accessing the contact pads 38 and the cathode and anode contacts 36-1, 34-1. The removal step may comprise a planarizing process, such as grinding, lapping, or polishing.

The encapsulant layer 40 may be applied or deposited by a coating or dispensing process. In certain embodiments, the encapsulant layer 40 may comprise one or more of a silicone, an epoxy, and a thermoplastic such as polycarbonate, aliphatic urethane, or polyester, among others. The encapsulant layer 40 may be configured to alter or control light output from the plurality of LEDs 28-1 to 28-3. For example, the encapsulant layer 40 may comprise an opaque or non-reflective material, such as a visibly grey, dark, or black material that may absorb some light that travels between the plurality of LEDs 28-1 to 28-3, thereby improving contrast between emissions of the plurality of LEDs 28-1 to 28-3 that pass through the submount 32. In certain embodiments, the encapsulant layer 40 may include light-absorbing particles suspended in a binder such as silicone or epoxy. The light-absorbing particles may include at least one of carbon, silicon, pigment, or metal particles or nanoparticles. In certain embodiments, the light-absorbing particles comprise a predominantly black color that when suspended in the binder provide a predominantly black or dark color for the encapsulant layer 40. Depending on the desired application, the encapsulant layer 40 may be configured as clear or light-transmissive, or the encapsulant layer 40 may comprise a light-reflecting or light-redirecting material such as fused silica, fumed silica, or titanium dioxide (TiO$_2$) particles that form a predominantly white color for the encapsulant layer 40. Other particles or fillers may be used to enhance mechanical, thermal, optical, or electrical properties of the encapsulant layer 40. In certain embodiments, the encapsulant layer 40 may include multiple layers with varying mechanical, thermal, optical, or electrical properties.

Various electrically conductive traces 42 and vias 44 may be formed below the LEDs 28-1 to 28-3 and the active electrical element 30. For example, the electrically conductive traces 42 may be formed on bottom surfaces of the encapsulant layer 40 and electrically coupled to various ones of the contact pads 38 and the cathode and anode contacts 36-1, 34-1. The electrically conductive traces 42 and vias 44 may form a multiple layer structure that effectively routes electrically conductive paths between the active electrical element 30 and the LEDs 28-1 to 28-3. An additional encapsulant layer 46 may be provided and certain ones of the electrically conductive traces 42 may be coupled to package bond pads 48-1 to 48-2 by way of certain ones of the vias 44. In this regard, the package bond pads 48-1 to 48-2 are configured to receive signals that are external to the LED package 26. In certain embodiments, the package bond pads 48-1 to 48-2 are configured to be mounted and bonded to another surface (e.g., a mounting surface of an LED panel that includes electrical traces or other types of signal lines) to receive external signals (e.g., from the control element 18 of FIG. 1B).

Figure 2D:
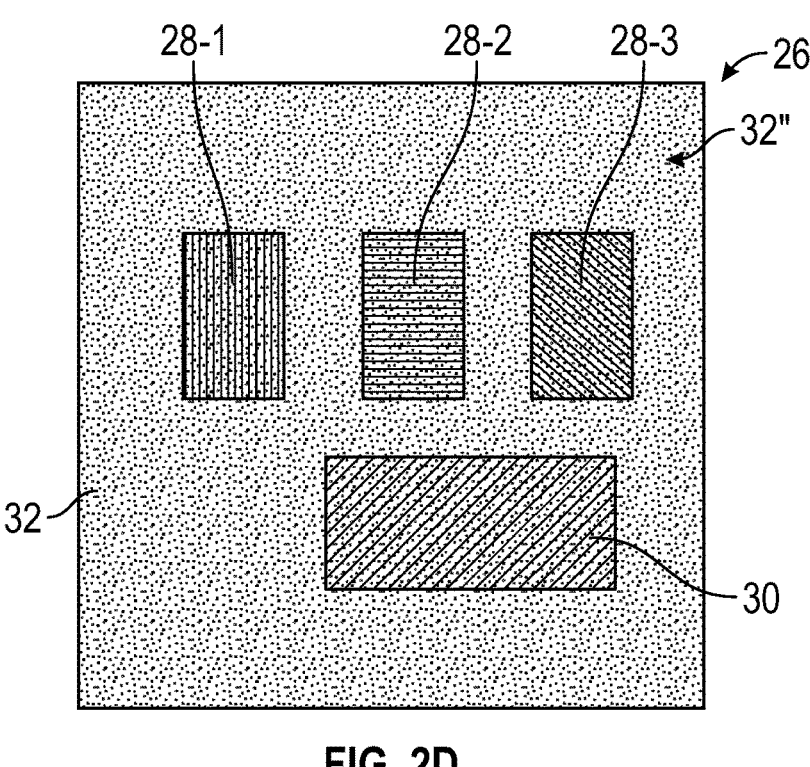
FIG. 2D is a simplified top view of the LED package of FIG. 2C.

FIG. 2D is a simplified top view of the LED package 26 of FIG. 2C. The view illustrated by FIG. 2D is from the second face 32" of the submount 32 and represents the primary emission face of the LED package 26. The plurality of LEDs 28-1 to 28-3 are accordingly configured below the submount 32 to provide light emissions that pass through submount 32 (e.g., a light-transmissive submount or light-transmissive superstrate). The active electrical element 30 is also configured below the submount 32 and all electrical connections and electrically conductive paths as previously described are accordingly arranged below the active electrical element 30 and below the plurality of LEDs 28-1 to 28-3 relative to the second face 32". Accordingly, light generated from the plurality of LEDs 28-1 to 28-3 may pass through the submount 32 and out of the second face 32" with reduced losses or absorption to electrical connections, electrically conductive paths, or other elements within the LED package 26.

Figure 2E:
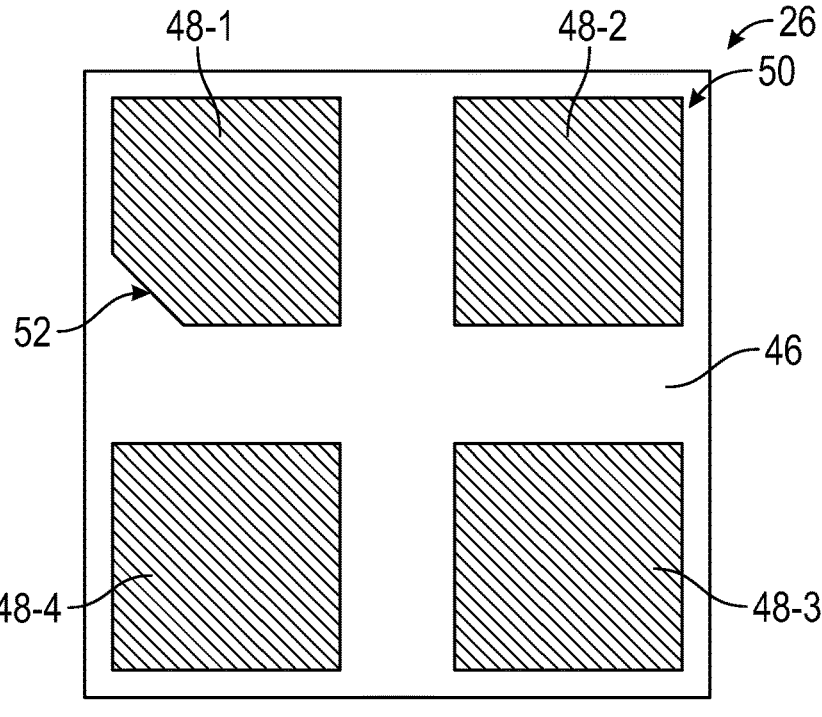
FIG. 2E is a simplified bottom view of the LED package of FIG. 2E.

FIG. 2E is a simplified bottom view of the LED package 26 of FIG. 2E. In operation, the bottom view illustrated by FIG. 2E represents a primary mounting face 50 of the LED package 26. In this regard, the LED package 26 is configured to be mounted to an external surface (e.g., a panel or PCB of a video display) such that package bond pads 48-1 to 48-4 are bonded or soldered to electrical communication lines provided on the external surface. In certain embodiments, at least one package bond pad 48-1 may comprise an identifier 52, such as a notch, a different shape, or other form of identifier that is configured to convey the polarity and mounting position of the LED package 26 on the external surface.

Figure 3:
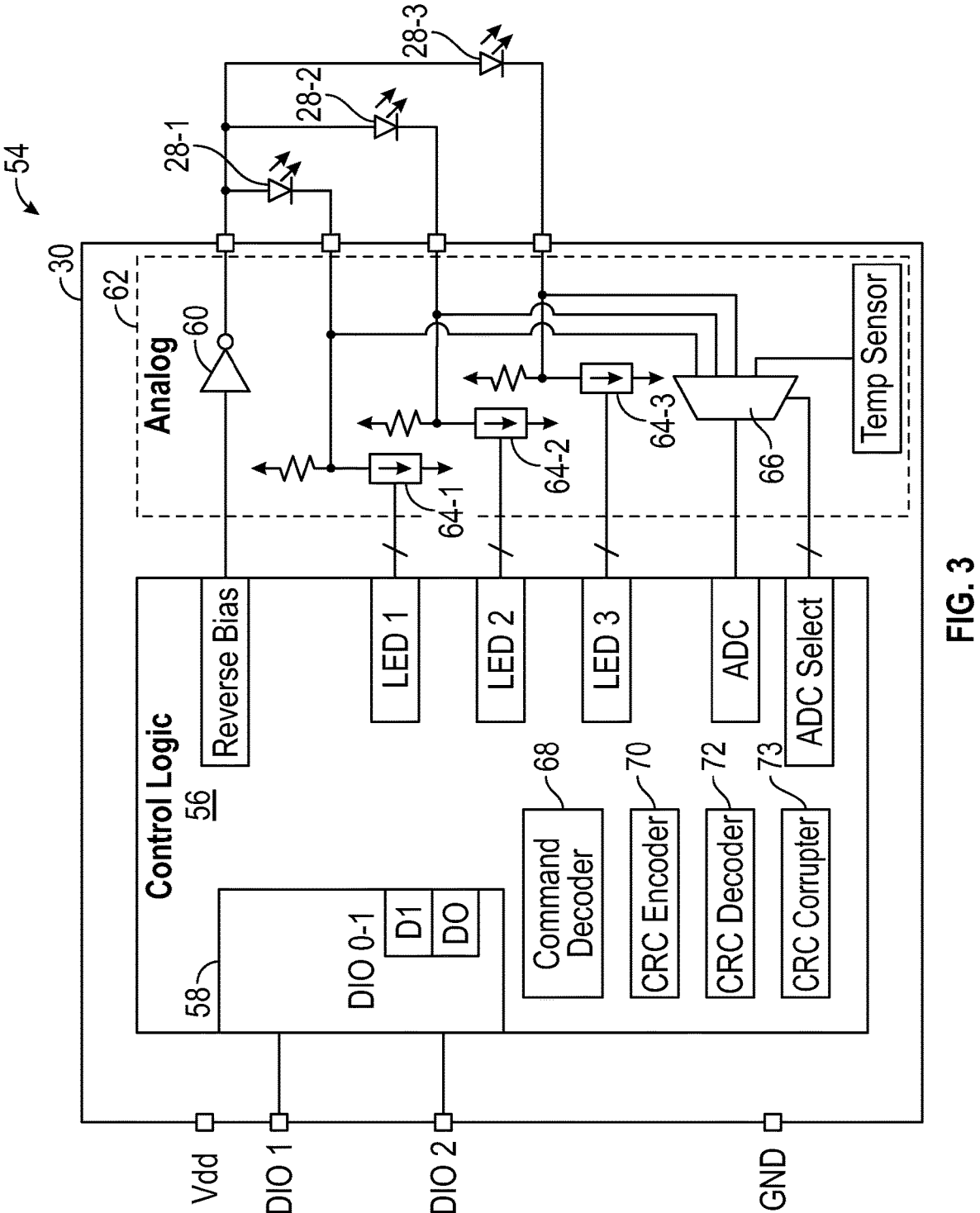
FIG. 3 is a schematic block diagram illustrating details of an LED package and integrated active electrical element configured to process error detection codes according to principles of the present disclosure.

FIG. 3 is a schematic block diagram of an LED package 54 and an integrated active electrical element 30 configured to process error detection codes according to principles of the present disclosure. The LED package 54 may be arranged with a similar structure as the LED package 26 of FIGS. 2A to 2E or with alternative structures. In certain embodiments, the LED package 54 forms an LED pixel for placement within a larger LED display. In this manner, the structure present in FIG. 3 may be present in each pixel of an active matrix display. The active electrical element 30 may include multiple ports represented by a supply voltage ($V_{dd}$), ground (GND or $V_{ss}$), and bidirectional communication ports or digital input/output ports (DIO1 and DIO2) according to embodiments disclosed herein. By having the DIO1 and DIO2 ports as bidirectional communication ports, the active electrical element 30 may advantageously be able to detect an input signal from a communication channel and then assign one of the DIO1 and DIO2 ports as an input port and the other of the DIO1 and DIO2 ports as the output port. This provides flexibility in layouts for displays where a plurality of LED packages 54 are connected together for cascade communication. For example, multiple LED packages 54 may be arranged in multiple rows where data cascades from package-to-package along each row and in serpentine manner from row-to-row. In addition to the four ports of $V_{dd}$, GND, DIO1, and DIO2 on the left side of the schematic, the active electrical element 30 includes four ports on the right side of the schematic that are coupled with the LEDs 28-1 to 28-3.

Various elements of the active electrical element 30 are described below, however it is understood that the active electrical element 30 may include many other components, including memory elements, signal conditioning elements, thermal management, electrostatic discharge elements, clock elements, and oscillators, among others. In FIG. 3, control logic 56 is arranged to receive input data, execute commands according to a command protocol, provide control signals for operation of the LEDs 28-1 to 28-3, report various voltage levels and/or temperature levels included with output data, and transmit the output data via the DIO1 and DIO2 ports to the next adjacent LED package. The control logic 56 may operate in the digital domain. The control logic 56 may include input/output buffers 58 (DIO 0-1 in FIG. 3) electrically coupled to the DIO1 and DIO2 ports, and DI and DO pins of the input/output buffers 58 are accessible to the control logic 56. The input/output buffers 58 are configured to assign input and output configurations for the bidirectional DIO1 and DIO2 ports.

In certain embodiments, the active electrical element 30 may be configured to provide both forward and reverse bias states to the LEDs 28-1 to 28-3. In this regard, the control logic 56 may include a reverse bias control output signal that, with appropriate active elements, is configured to supply either near-$V_{dd}$ or near-GND voltage levels to the LEDs 28-1 to 28-3. Since the nomenclature "reverse bias" implies that a high level on the control logic 56 output produces a reverse bias condition, the output signal could simply be coupled with an inverter 60 that is provided in a driver 62 of the active electrical element 30. As such, the LEDs 28-1 to 28-3 may be either forward biased or reverse biased depending on a particular operating state and/or command received by the control logic 56. The inverter 60, or inverter logic element, may have sufficient output characteristics to drive the LEDs 28-1 to 28-3. The driver 62 may be substantially an analog interface of the active electrical element 30 that is electrically coupled with the control logic 56. The driver 62 may include controllable current sources 64-1 to 64-3 which could also be configured as LED sink drivers. Pull-up resistors R1 to R3 may be incorporated to provide paths to $V_{dd}$ for each of the LEDs 28-1 to 28-1 which aid with the voltage measurement when configured for reverse bias. Each of the current sources 64-1 to 64-3 may be electrically coupled with digital output signals LED1 to LED3 of the control logic 56. The output signals LED1 to LED3 may be provided along multiple wires that are coupled to each of the current sources 64-1 to 64-3 for current selection purposes. The output signals LED1 to LED3 may embody PWM outputs of the control logic 56 for controlling operation of the LEDs 28-1 to 28-3. The driver 62 may also include a multiplexer 66 electrically coupled with an analog-to-digital (ADC) converter and ADC selector of the control logic 56. Additionally, the driver 62 may include an on-chip temperature sensor that is provided through the multiplexer 66. In certain embodiments, the temperature sensor provides thermal compensation for the LEDs 28-1 to 28-3 and/or thermal shut down via a thermal compensation curve.

As illustrated in FIG. 3, the control logic 56 may include a command decoder 68 that is configured to decode data blocks received from the communication channel and a CRC encoder 70 and a CRC decoder 72. The CRC decoder 72 allows the active electrical element to check for input error detection codes, such as CRCs, received in the communication channel, and the CRC encoder 70 is configured to generate new output CRCs for output into the same communication channel and/or another communication channel. In certain embodiments, the LED package 54 is capable of changing one or more portions of received data and transmitting the changed data to the next downstream LED package or other receiving element such as a controller. When the LED package 54 changes data, the active electrical element 30 generates a new CRC via the CRC encoder 70 that corresponds with the changed data. In instances where the active electrical element 30 detects an error with the input CRCs, the CRC encoder 70 will generate the correct code of the new data. However, in the case where the received data is corrupted, it may be desirable to propagate a corrupt CRC to the output so that downstream devices will also interpret the data as being corrupted. The active electrical element 30 may responsively generate a corrupt CRC that is intentionally corrupted by way of a CRC corrupter 73 to notify other LED packages and other receiving elements of corrupted data. The CRC corrupter 73 may be one of many common logic elements that produces a code that is guaranteed to be different from the correct code. One such example is a logic circuit designed to simply invert the last bit of the correct CRC code. While FIG. 3 is provided in the context of the active electrical element 30 decoding and encoding CRCs, the same principles apply for any type of error detection codes such that the CRC encoder 70 and the CRC decoder 72 may respectively be referred to as an encoder and a decoder.

Figures 4, 5:
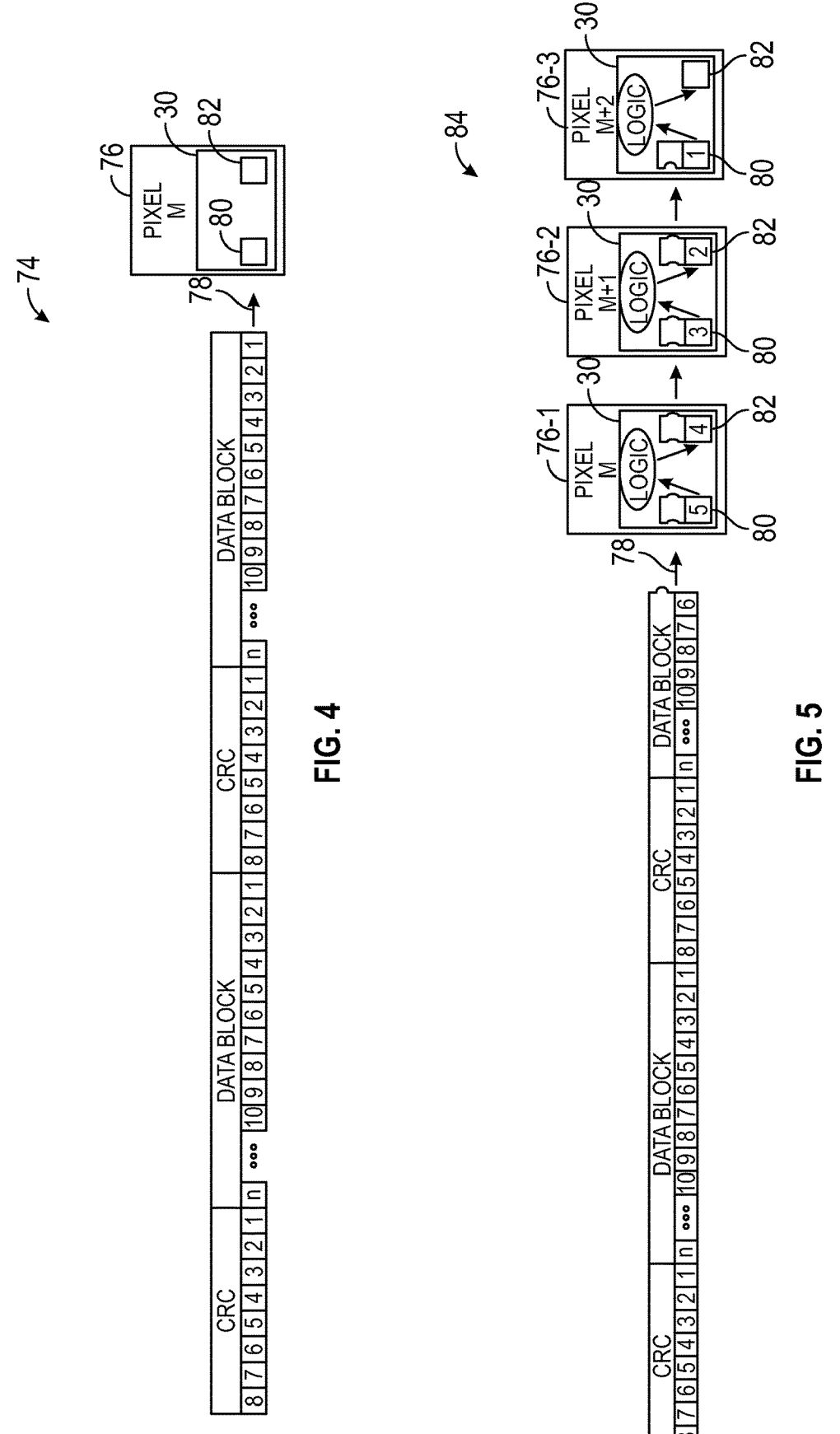
FIG. 4 is a block diagram illustrating cascade communication for an LED package according to principles of the present disclosure.
FIG. 5 is a diagram similar to the diagram of FIG. 4 and further showing progression of data bits through multiple LED packages after five clock cycles of cascade communication.

FIG. 4 is a block diagram 74 illustrating cascade communication for an LED package 76 according to principles of the present disclosure. The LED package 76 may embody any of the previously described LED packages of FIGS. 2A to 2E and FIG. 3 that are arranged as pixels in a display as illustrated in FIG. 1A. Input communication from a data stream 78 of a communication channel is received by the LED package 76 and transferred from an input register 80 to an output register 82 that are graphically illustrated as boxes within the LED package 76. The input and output registers 80, 82 represent memory locations within the active electrical element 30. The data stream may include data blocks of any lengths with bits illustrated by the numbering 1, 2, 3, 4 . . . n, followed by CRCs. The data blocks may include a command code that is processed by the active electrical element 30 (e.g., the command decoder 68 of FIG. 3) of the LED package 76 for controlling actions of the active electrical element 30 and/or controlling operation of LEDs within the LED package 76. In FIG. 4, the CRCs are illustrated as 8-bit CRCs, although the CRCs could be other lengths depending on the particular implementation. In still further embodiments, the principles disclosed are applicable to any type of error detection codes that follow the data blocks with the purpose to at least partially validate the preceding data.

During operation, each data bit of the data block and the CRC codes is sequentially received and held by the input register 80 during one clock cycle and then transferred to the output register 82 with each clock cycle. In some instances, the bit data transferred to the output register 82 is changed or modified based on operation of the LED package 76. For example, a command code of the data block for operating the specific LED package 76 may be received and implemented, and the corresponding command code transferred to the output register 82 may be changed to codes corresponding to information intended to be relayed back to a master controller for processing. In one such case, the LED package 76 receives brightness data and replaces that data with temperature data to be conveyed back to the controller. When data is changed by the LED package 76, the CRC encoder 70 of FIG. 3 may provide an updated CRC code to the output register 82 for transmission to the next LED package or other receiving element. Other portions of the data block may correspond with command codes for other LED packages downstream of the LED package 76 of FIG. 4 and may be transferred through the LED package 76 without modification.

When bit data is received in the input register 80, the bit data may be decoded by the CRC decoder 72 of FIG. 3 and expected CRC values may be calculated. The calculated CRC values may then be compared with the CRC bit data received to either verify the data or identify corrupted data. If corrupted data is identified and the LED package 76 does not change any data, then downstream LED packages may also be able to detect the corrupted data. However, if the LED package 76 changes data as described above, the newly generated CRC that accounts for the changed data may inadvertently correct the flawed CRC received from the data stream and downstream LED packages may not be able to identify the corrupted data. According to principles of the present disclosure, the LED package 76 and incorporated active electrical element 30 are configured with the CRC corruptor 73 to intentionally generate a corrupted CRC code when the LED package 76 identifies data errors and the LED package 76 changes data. In this manner, the LED package 76 may be configured to notify downstream LED packages of corrupted data, even when data is changed.

FIG. 5 is a diagram 84 similar to the diagram 74 and further showing progression of data bits through multiple LED package 76-1 to 76-3 after five clock cycles of cascade communication. As illustrated, bit positions of the data block and CRC may progress sequentially, shifting from left to right, through the input and output registers 80, 82 of the multiple LED packages 76-1 to 76-3 according to clock cycles. In this manner, a first bit position (i.e., "1") of a data block may already be held in the input register 80 of the third LED package 76-3, while bit positions "2" and "3" are in the second LED package 76-2, bit positions "4" and "5" are in the first LED package 76-1, and the remaining bit positions have yet to be received by the LED packages 76-1 to 76-3. In FIG. 5, superimposed boxes are illustrated above the input and output registers 80, 82 to represent data blocks with respective bit positions now being distributed among multiple LED packages. The numbers in the input and output registers 80, 82 represent the bit positions of the first data block at this snapshot in time which is the fifth clock cycle. During operation, the active electrical element 30 of the first LED package 76-1 cannot determine the validity of the data block until the last bit position of the CRC code is processed after n+8 clock cycles. Meanwhile other bits of the CRC code may already be progressing through the second and third LED packages 76-2, 76-3, which would include the first several bits of a corrected CRC code generated by the CRC encoder 70. For example, 7 out of 8 bit positions of an 8-bit CRC code will have already exited the LED package 76-1 before the data is confirmed as corrupt at the 8th and last bit position. In certain embodiments, upon receiving the last bit position of a CRC code and identifying corrupt data, the first LED package 76-1 may intentionally corrupt the last bit position (i.e., "8" of the CRC in FIG. 5) when transferring it to the output register 82. One way to intentionally corrupt the last bit position of the CRC is to apply bit reversal or inverting the value of the last bit position (i.e., changing a 1 to 0, or vice versa). Accordingly, each downstream LED package 76-2, 76-3 may correctly identify corrupted data, even though the first LED package 76-1 has changed certain data and generated an updated CRC code. In this case, the receiving LED package 76-2 would receive a block of data with the correct CRC having its last bit inverted, thus flagging the data as corrupt. In turn, the downstream LED packages 76-2, 76-3 may also be configured to independently change data, generate updated CRC codes, and intentionally corrupt the generated CRC codes when necessary.

The example embodiments described above for FIG. 5 illustrate one implementation where the data stream of the communication channel is delayed by two clock cycles for each LED package 76-1 to 76-3. Other embodiments are contemplated where the delay is different. For example, LED packages 76-1 to 76-3 may receive larger portions of data blocks such as whole 8-bit bytes, make decisions, then transmit larger portions of data to the next receiving element or downstream LED package after that first portion is received. In this way, other embodiments of the CRC corrupter 73 are contemplated as there are numerous means known in the art to generate a code that is different from a given code.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
at least one LED chip; and
an active electrical element electrically connected to the at least one LED chip, the active electrical element configured to:
receive a data block and an input error detection code from a communication channel;
change at least one portion of the data block;
generate an output error detection code corresponding to the at least one portion of the data block that is changed; and
apply bit reversal to the output error detection code to provide a corrupt output error detection code that replaces the input error detection code.

2. The LED package of claim 1, wherein the active electrical element comprises logic to provide the corrupt output error detection code.

3. The LED package of claim 1, wherein the active electrical element is configured to identify data corruption of the data block and provide the corrupt output error detection code so that the data corruption is identified by other elements arranged to receive the corrupt output error detection code.

4. The LED package of claim 3, wherein the active electrical element is configured to generate a calculated error detection code based on the data block and the at least one portion of the data block that is changed and the bit reversal comprises inverting a value of a last bit of the calculated error detection code to generate the corrupt output error detection code.

5. The LED package of claim 1, wherein the input error detection code is an input cyclic redundancy check (CRC) and the output error detection code is an output CRC.

6. The LED package of claim 5, wherein the active electrical element comprises a CRC decoder configured to receive the input CRC and a CRC encoder configured to generate the output CRC.

7. The LED package of claim 1, wherein the active electrical element comprises a first bidirectional communication port and a second bidirectional communication port.

8. The LED package of claim 7, wherein the active electrical element is configured to detect an input signal at the first bidirectional communication port, assign the first bidirectional communication port as an input port, and assign the second bidirectional communication port as an output port.

9. The LED package of claim 1, further comprising:
a submount on which the at least one LED chip and the active electrical element are mounted;
an encapsulant layer on the submount and on portions of the least one LED chip and the active electrical element; and
package bond pads electrically coupled to the at least one LED chip and the active electrical element.

10. A light-emitting diode (LED) package comprising:
at least one LED chip; and
an active electrical element electrically connected to the at least one LED chip, the active electrical element configured to:
receive an input error detection code from a communication channel;
generate a calculated error detection code based on the input error detection code;
generate a corrupt output error detection code by applying bit reversal to the calculated error detection code; and
send the corrupt output error detection code along the communication channel or to another communication channel.

11. The LED package of claim 10, wherein the input error detection code is an input cyclic redundancy check (CRC) and the corrupt output error detection code is a corrupt output CRC.

12. The LED package of claim 11, wherein the active electrical element further comprises a CRC encoder, a CRC decoder, and a CRC corrupter that receives a data block from the communication channel and identifies data corruption of the data block in order to generate the corrupt output CRC.

13. The LED package of claim 12, wherein the active electrical element is further configured to change at least one portion of the data block as the data block passes through the active electrical element and return the data block that is changed to the communication channel or another communication channel in order to generate the corrupt output CRC.

14. The LED package of claim 13, wherein the active electrical element is configured to generate the calculated error detection code as a calculated CRC based on the input CRC and the at least one portion of the data block that is changed and the bit reversal comprise inverting a value of a last bit of the calculated CRC to generate the corrupt output CRC.

15. The LED package of claim 10, wherein the active electrical element comprises a first bidirectional communication port and a second bidirectional communication port.

16. The LED package of claim 10, further comprising:

a submount on which the at least one LED chip and the active electrical element are mounted;

an encapsulant layer on the submount and on portions of the at least one LED chip and the active electrical element; and package bond pads electrically coupled to the at least one LED chip and the active electrical element.

17. A light-emitting diode (LED) package comprising:

at least one LED chip; and an active electrical element electrically connected to the at least one LED chip, the active electrical element configured to:

receive an input error detection code from a communication channel;

generate a calculated error detection code based on the input error detection code; and invert a last bit of the calculated error detection code to generate an output error detection code.

18. The LED package of claim 17, wherein the input error detection code is an input cyclic redundancy check (CRC), the calculated error detection code is a calculated CRC, and the output error detection code is an output CRC.

19. The LED package of claim 18, wherein the active electrical element is configured to transmit the output CRC to the communication channel or to another communication channel.

20. The LED package of claim 18, wherein the active electrical element is configured to receive a data block from the communication channel and identify data corruption of the data block in order to generate the output CRC.

21. The LED package of claim 20, wherein the active electrical element is further configured to change at least one portion of the data block that the active electrical element transmits to the communication channel or to another communication channel.

22. The LED package of claim 17, wherein the active electrical element comprises a first bidirectional communication port and a second bidirectional communication port.

23. The LED package of claim 17, further comprising:

a submount on which the at least one LED chip and the active electrical element are mounted;

an encapsulant layer on the submount and on portions of the at least one LED chip and the active electrical element; and package bond pads electrically coupled to the at least one LED chip and the active electrical element.

* * * * *